United States Patent
Yokohara et al.

(10) Patent No.: US 10,254,693 B2
(45) Date of Patent: Apr. 9, 2019

(54) FIXING UNIT OF PLATE-SHAPED MEMBER, PVD PROCESSING APPARATUS AND FIXING METHOD OF PLATE-SHAPED MEMBER

(71) Applicant: Tokyo Electron Limited, Tokyo (JP)

(72) Inventors: Hiroyuki Yokohara, Yamanashi (JP);
Shinji Orimoto, Yamanashi (JP);
Hiroshi Sone, Yamanashi (JP);
Naoyuki Suzuki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 299 days.

(21) Appl. No.: 14/740,805

(22) Filed: Jun. 16, 2015

(65) Prior Publication Data
US 2015/0370204 A1    Dec. 24, 2015

(30) Foreign Application Priority Data

Jun. 19, 2014  (JP) ................. 2014-126558

(51) Int. Cl.
*G03G 15/20* (2006.01)
*H01J 37/34* (2006.01)
*C23C 14/34* (2006.01)

(52) U.S. Cl.
CPC ..... *G03G 15/2064* (2013.01); *C23C 14/3407* (2013.01); *H01J 37/3435* (2013.01)

(58) Field of Classification Search
CPC ............. H01J 37/3435; C23C 14/3407; G03G 15/2064
See application file for complete search history.

(56) References Cited

U.S. PATENT DOCUMENTS 5,536,380 A * 7/1996 Ocker ................. C23C 14/3407
204/298.09
2007/0151841 A1* 7/2007 Inagawa ............. C23C 14/3407
204/192.1

FOREIGN PATENT DOCUMENTS

JP          2013-036092 A      2/2013

\* cited by examiner

*Primary Examiner* — John J Brayton

(57) ABSTRACT

A fixing unit fixes a plate-shaped member to a fixing base member. The fixing unit includes: a pressing unit configured to press the plate-shaped member toward the fixing base member; and a plurality of positioning units, installed at the fixing base member to be in contact with side surfaces of the plate-shaped member, and configured to place the plate-shaped member with respect to the fixing base member. Each of the positioning units includes: a shaft to be installed at the fixing base member; and a slide part movable along the shaft, and the slide part includes a contact part to be in contact with one of the side surfaces of the plate-shaped member and a clearance part formed on the contact part to have a smaller width than that of the contact part.

11 Claims, 6 Drawing Sheets

FIXING UNIT OF PLATE-SHAPED MEMBER, PVD PROCESSING APPARATUS AND FIXING METHOD OF PLATE-SHAPED MEMBER

CROSS-REFERENCE TO RELATED APPLICATION

This application claims priority to Japanese Patent Application No. 2014-126558 filed on Jun. 19, 2014, the entire contents of which are incorporated herein by reference.

FIELD OF THE INVENTION

The disclosure relates to a fixing unit for a plate-shaped member, a PVD (e.g., physical vapor deposition) processing apparatus, and a fixing method for a plate-shaped member.

BACKGROUND

In a PVD film forming apparatus for performing a PVD film forming process on a substrate, e.g., a semiconductor wafer (hereinafter, referred to simply as "wafer"), a target of a film forming material is provided in a processing chamber. The PVD film forming apparatus forms a thin film of the film forming material on the wafer by generating plasma in a processing space, sputtering the target by the plasma, and depositing scattered sputter particles of the film forming material on the wafer. The target is exposed to the processing space and fixed above the wafer so that the scattered sputter particles can be more effectively deposited by gravity (see, e.g., Japanese Patent Application Publication No. 2013-36092).

Recently, there is provided a shutter member to switch execution and stop thin film formation in the PVD film forming apparatus. The shutter member, i.e., a screen member having an opening, is disposed between the processing space and the target. While the thin film formation is stopped, the target is shielded from the processing space. When the thin film formation is executed, the target is exposed to the processing space through the opening facing the target.

A shield member is provided around the target in order to prevent the target and the fixing member from being unnecessarily sputtered by an unintended entrance of the plasma. A clearance between the target and the shield member is set to be very small.

In order to reliably attract the plasma, to the target, a negative voltage is applied to the target. Thus, the target serves as a cathode electrode. If the target is not exactly positioned with respect to the shield member, the gap between the target and an edge of the shield member becomes excessively small. Accordingly, the target and the edge of the shield member are short-circuited by a deposit or the like during the thin film formation. As a result, a negative voltage may also be applied to the processing chamber through the shield member.

For that reason, when a target having, e.g., a rectangular shape is fixed, positioning members such as positioning blocks or the like are provided to be in contact with four side surfaces of the target to precisely position the target with respect to the shield member.

However, when the positioning blocks are made to be in contact with the four side surfaces of the target, thermal expansion of the target during the sputtering is restricted. Accordingly, the target is deformed by an increase of an internal stress, which may result in breakage of the target.

A fine gap may be provided between the positioning blocks and the side surfaces of the target so that the thermal expansion of the target during the sputtering is not restricted. In this case, however, an installation position of the target varies depending on a skill of an operator, and a distance between the target and the edge of the shield member may become excessively small.

SUMMARY OF THE INVENTION

In view of the above, the disclosure provides a fixing unit for fixing a plate-shaped member which can place the plate-shaped member while preventing deformation of the plate-shaped member due to thermal expansion, a PVD processing apparatus, and a fixing method for fixing a plate-shaped member.

In accordance with a first aspect of the present invention, there is provided a fixing unit for fixing a plate-shaped member to a fixing base member, the fixing unit including: a pressing unit configured to press the plate-shaped member toward the fixing base member; and a plurality of positioning units, installed at the fixing base member to be in contact with side surfaces of the plate-shaped member, and configured to place the plate-shaped member with respect to the fixing base member, wherein each of the positioning units includes: a shaft to be installed at the fixing base member in a direction perpendicular to a surface of the fixing base member; and a slide part movable along the shaft, and wherein the slide part includes a contact part configured to be in contact with one of the side surfaces of the plate-shaped member and a clearance part formed on the contact part to have a smaller width, in a direction parallel to the surface of the fixing base member, than that of the contact part.

In accordance with a second aspect of the present invention, there is provided a PVD processing apparatus for performing PVD processing on a substrate, the apparatus including: a chamber having a processing space therein; a target that is a plate-shaped member exposed to the processing space; a shutter member having an opening, and disposed between the processing space and the target; a fixing base member provided at the chamber; and a fixing unit configured to fix the target to the fixing base member, wherein the fixing unit includes: a pressing unit for pressing the target against the fixing base member; a plurality of positioning units installed at the fixing base member to be in contact with side surfaces of the target, the positioning units serving to place the target with respect to the fixing base member; wherein each of the positioning units has a shaft installed in a direction perpendicular to a surface of the fixing base member and a slide part movable along the shaft, and wherein the slide part includes a contact part to be in contact with one of the side surfaces of the target and a clearance part formed on the contact part to have a smaller width, in a direction parallel to the surface of the fixing base member, than that of the contact part.

In accordance with a third aspect of the present invention, there is provided a fixing method for fixing a plate-shaped member to a fixing base member by a fixing unit, the fixing unit including: a pressing unit configured to press the plate-shaped member toward the fixing base member; and a plurality of positioning units, installed at the fixing base member to be in contact with side surfaces of the plate-shaped member and configured to place the plate-shaped member with respect to the fixing base member, wherein each of the positioning units includes: a shaft to be installed at the fixing base member in a direction perpendicular to a surface of the fixing base member; and a slide part moving along the shaft, and wherein the slide part includes a contact part to be in contact with one of the side surfaces of the plate-shaped member and a clearance part formed on the contact part to have a smaller width, in a direction parallel to the surface of the fixing base member, than that of the contact part, the fixing method including: positioning the plate-shaped member with respect to the fixing base member by allowing the contact parts of the slide parts of the plurality of positioning units respectively contact with at least two side surfaces of the plate-shaped member; fixing the plate-shaped member to the fixing base member by pressing the plate-shaped member against the fixing base member by the pressing unit so that the slide parts of the positioning units are respectively moved along the corresponding shafts to allow the clearance parts of the slide parts to be arranged to face the corresponding side surfaces of the plate-shaped member.

BRIEF DESCRIPTION OF THE DRAWINGS

The objects and features of the disclosure will become apparent from the following description of embodiments, given in conjunction with the accompanying drawings, in which:

FIGS. 3A and 3B are diagrams for explaining a method of fixing a target to a holder in FIG. 2, wherein FIG. 3A is a top view of the target seen in a direction of a white arrow in FIG. 2 and FIG. 3B is a cross sectional view taken along a line 3B-3B in FIG. 3A;

DETAILED DESCRIPTION OF THE EMBODIMENTS

Hereinafter, embodiments will be described with reference to the accompanying drawings.

Figure 1:
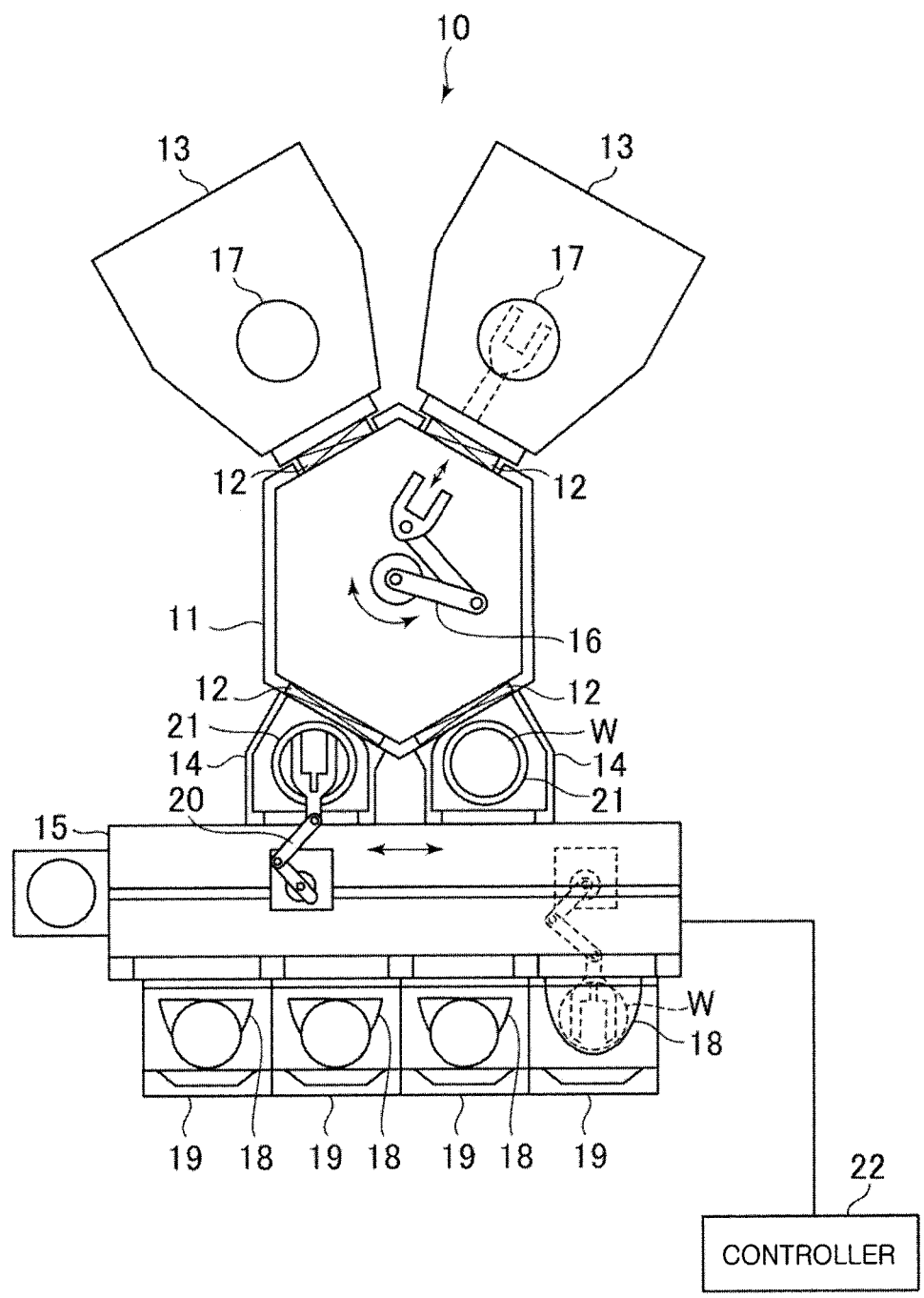
FIG. 1 is a top view schematically showing a configuration of a substrate processing system including a process module as a PVD processing apparatus according to an embodiment.

FIG. 1 is a top view schematically showing a configuration of a substrate processing system including a process module as a PVD processing apparatus according to an embodiment. In FIG. 1, a hidden part of the configuration is illustrated for better understanding.

Referring to FIG. 1, a substrate processing system 10 includes: a transfer module 11; two process modules 13 connected to the transfer module 11 via gate valves 12; two load-lock modules 14 connected to the transfer modules 11 via gate valves 12; and a loader-module 15 connected to the transfer module 11 through the load-lock modules 14.

The transfer module 11 is an approximately hexagonal transfer chamber when seen from the top. Provided in the transfer module 11 is a transfer arm 16 for transferring a wafer W between each of the process modules 13 and each of the load-lock modules 14. An inside of the transfer module 11 is maintained in a depressurized state.

Provided in each process module 13 is a single stage 17 for mounting thereon a wafer W. As in the case of the transfer module 11, an inside of each process module 13 is maintained in a depressurized state. Each process module 13 forms a thin film of a metal or the like on the wafer W mounted on the stage 17 by performing PVD processing on the wafer W. The configuration of the process module 13 will be described in detail later.

The loader module 15 is a housing-shaped atmospheric transfer chamber maintained in an atmospheric state. Four ports 19 serving as receiving ports for containers 18 each accommodating therein a plurality of wafers W are provided at a side surface of the loader module 15 which is opposite to the side surface where the load-lock modules 14 are connected. Provided in the loader module 15 is a transfer robot 20 for transferring the wafer W between each of the containers 18 and each of the load-lock modules 14.

Each of the load-lock modules 14 is a chamber whose inside can be switched between an atmospheric state and a depressurized state. A stage 21 for mounting thereon a wafer W is provided in each of the load-lock modules 14. When the wafer W is transferred between the load-lock module 14 and the transfer robot 20 of the loader module 15, the inside of the load-lock module 14 is switched to the atmospheric state and the inside of the load-lock module 14 communicates with the inside of the loader module 15. On the other hand, when the wafer W is transferred between the load-lock module 14 and the transfer arm 16 of the transfer module 11, the inside of the load-lock module 14 is switched to the depressurized state and the inside of the load-lock module 14 communicates with the inside of the transfer module 11. In other words, the inside environment of the load-lock module 14 is switched between the atmospheric state and the depressurized state to transfer the wafer W with respect to the transfer module 11 and the loader module 15. The operations of the respective components of the substrate processing system 10 are controlled by a controller 22.

Figure 2:
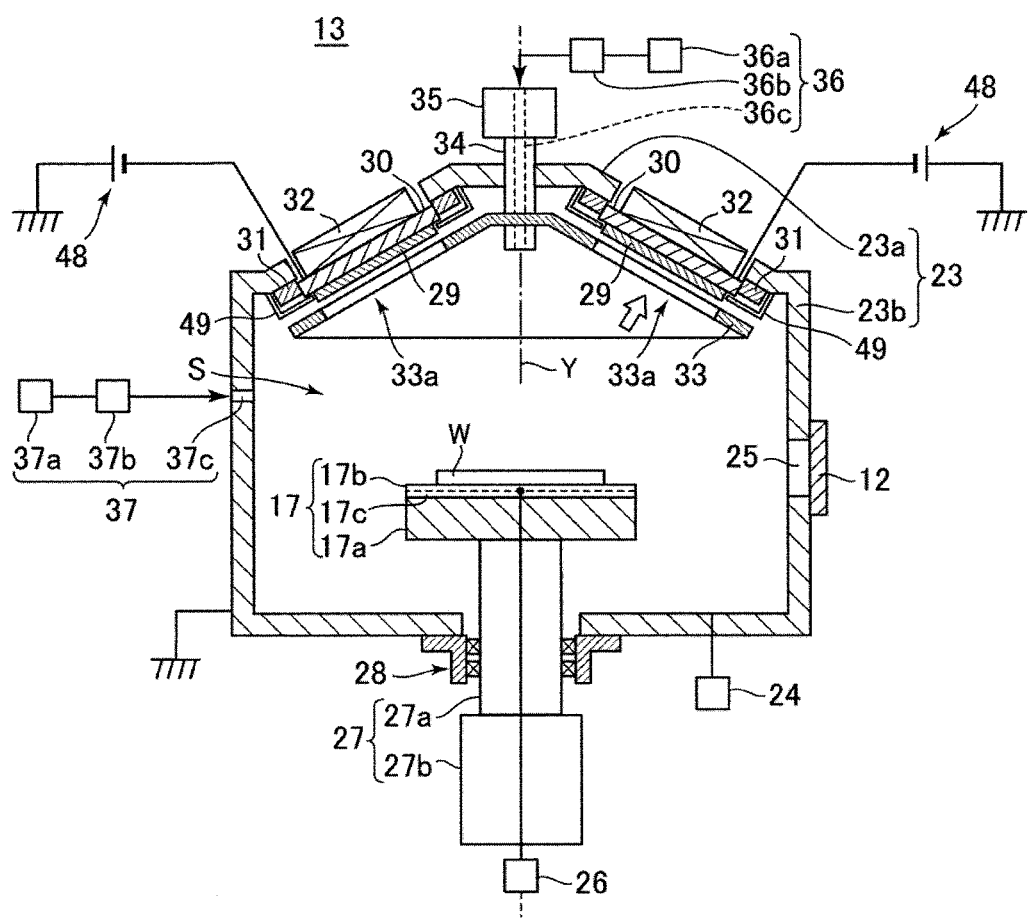
FIG. 2 is a cross sectional view schematically showing a configuration of the process module shown in FIG. 1.

FIG. 2 is a cross sectional view schematically showing a configuration of the process module shown in FIG. 1.

Referring to FIG. 2, the process module 13 includes: an approximately cylindrical chamber 23 made of, e.g., aluminum; a stage 17, provided at a lower portion of a processing space S in the chamber 23, for mounting thereon a wafer W; and a gas exhaust unit 24 having, e.g., a cryopump or a dry pump, for maintaining the processing space S of the chamber 23 in a depressurized state.

The chamber 23 is grounded. The chamber 23 includes a ceiling portion 23a disposed to face the stage 17 and having a conical shape protruding upward in FIG. 2. A loading/unloading port 25 for a wafer W is formed at a sidewall 23b of the chamber 23. The loading/unloading port 25 is opened and closed by a gate valve 12. The stage 17 includes an approximately disc-shaped base 17a made of, e.g., aluminum, and an electrostatic chuck 17b formed on the base 17a. The electrostatic chuck 17b has therein an electrode film 17c connected to a DC power supply 26. The electrostatic chuck 17b attracts and holds the wafer W mounted on the stage 17 by an electrostatic force generated when a DC voltage is applied to the electrode film 17c.

The stage 17 is supported by a stage driving mechanism 27 provided at a bottom portion of the chamber 23. The stage driving mechanism 27 includes a cylindrical supporting shaft 27a extended along an up-down direction in FIG. 2 and a driving unit 27b connected to a lower end of the supporting shaft 27a. The supporting shaft 27a is connected to a center of a bottom portion of the base 17a. The driving unit 27b rotates the supporting shaft 27a about a central axis Y of the chamber 23. Accordingly, the stage driving mechanism 27 rotates the stage 27 on a horizontal plane. Since the driving unit 27b moves the supporting shaft 27a in the up-down direction in FIG. 2, the stage 17 can also be moved in the up-down direction in FIG. 2. The supporting shaft 27a of the stage driving mechanism 27 penetrates through the bottom portion of the chamber 23. A sealing member 28 is provided between the supporting shaft 27a and the bottom portion of the chamber 23.

A plurality of, e.g., four, targets 29 (plate-shaped members) is provided at the ceiling portion 23a of the chamber 23. Each of the targets 29 is a rectangular plate-shaped member of a film forming material, e.g., cobalt (Co), copper (Cu), titanium (Ti), tantalum (Ta), ferrocobalt (CoFe), cobalt iron boron (CoFeB), ruthenium (Ru) or platinum manganese (PtMn). At the ceiling portion 23a, the targets 29 are arranged at a regular interval on the same circumference about the central axis Y of the chamber 23. The targets 29 are respectively fixed to holders 30 (fixing base members) made of, e.g., a metal. The holders 30 are provided at the ceiling portion 23a through the respective insulating members 31. The holders 30 hold the respective targets 29 to face the wafer W mounted on the stage 17.

The targets 29 are respectively connected to DC power supplies 48 through the holders 30. Each of the DC power supplies 48 applies, e.g., a negative DC voltage, to each of the targets 29. Thus, the targets 29 serve as cathode electrodes. When a single DC power supply 48 is provided, the single DC power supply 48 applies a negative DC voltage to each of the targets 29. Magnets 32 are disposed opposite to the targets 29 through the holders 30.

A shutter member 33 is provided between the targets 29 and the processing space S in the chamber 23. The shutter member 33 has an umbrella shape. A vertical angle of the shutter member 33 is set to be equal to that of the ceiling portion 23a. The central axis of the shutter member 33 coincides with the central axis Y of the chamber 23. Therefore, inclined surfaces of the shutter member 33 face the targets 29.

Formed at the shutter member 33 is a single opening 33a or a plurality of openings 33a spaced from each other on the same circumference at a regular interval same as that between the targets 29. A lower end of a rotary shaft 34 extending from the center of the ceiling portion 23a downward in FIG. 2 is connected to the central portion of the shutter member 33. The rotary shaft 34 is extended along the central axis Y of the chamber 23 while penetrating through the ceiling portion 23a. An upper end of the rotary shaft 34 is connected to a driving unit 35 provided above the chamber 23. As the driving unit 35 rotates the rotary shaft 34 about the central axis Y of the chamber 23, the shutter member 33 rotates about the central axis Y of the chamber 23.

When the shutter member 33 rotates about the central axis Y of the chamber 23, the relative positions between the targets 29 and the openings 33a are changed. When the targets 29 face the openings 33a, the targets 29 are exposed to the processing space S. When the targets 29 do not face the openings 33a, the targets 29 are shielded from the processing space S by the shutter member 33.

The process module 13 includes: a rare gas supply unit 36 for supplying a rare gas, e.g., argon (Ar) gas, into the processing space S; and a nitrogen gas supply unit 37 for supplying, e.g., nitrogen ($N_2$) gas, into the processing space S. The rare gas supply unit 36 has a rare gas source 36a, a flow rate controller (mass flow controller) 26b, and a gas line 36c formed along the central axis of the rotary shaft 34. The nitrogen gas supply unit 37 has a nitrogen gas source 37a, a flow rate controller 37b, and a gas line 37c penetrating through the sidewall 23b of the chamber 23.

In the process module 13, when argon gas is supplied from the rare gas supply unit 36 into the processing space and a negative DC voltage is applied to each of the targets 29, the argon gas is excited and a plasma is generated in the processing space S. At this time, a magnetic field is generated near each of the targets 29 by the magnets 32 and the plasma is concentrated near the targets 29 by the magnetic field. Since the targets 29 serve as cathode electrodes as described above, the targets 29 are sputtered by positive ions in the plasma. Accordingly, sputtered particles scatter from the targets 29 and are deposited on the wafer W. As a result, a cobalt thin film, for example, is formed on the wafer W.

Further, in the process module 13, nitrogen gas is supplied from the nitrogen gas supply unit 37 into the processing space S. Therefore, the cobalt thin film formed on the wafer W is modified to a nitride cobalt film.

In the process module 13, when the targets 29 face the openings 33a of the shutter member 33, the targets 29 are sputtered by positive ions. In order to prevent unnecessary sputtering of the edges of the targets 29 by the positive ions, shield members 49 are provided around the targets 29.

Figure 3A:
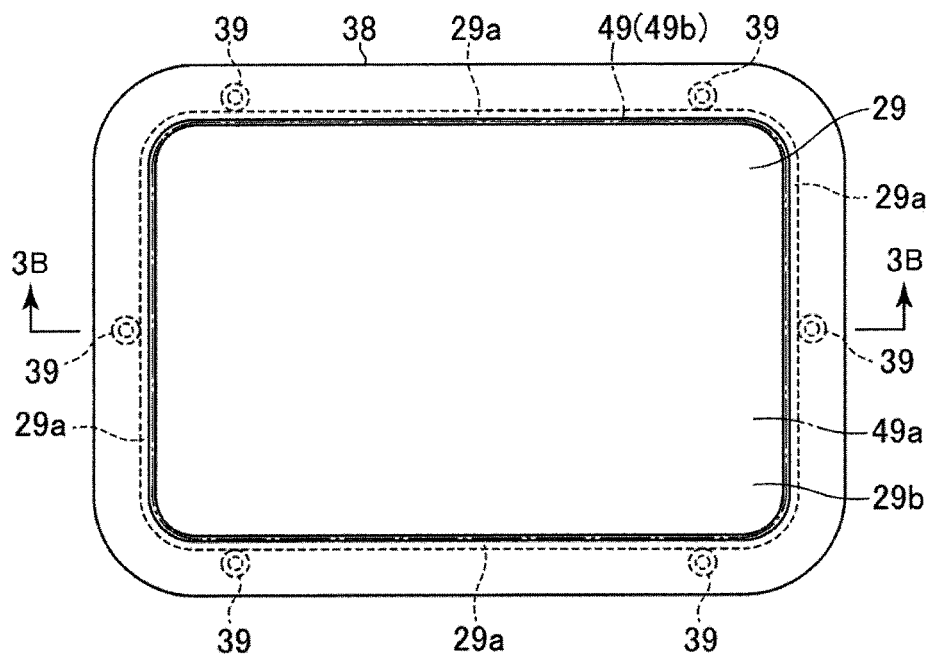
Figure 3B:
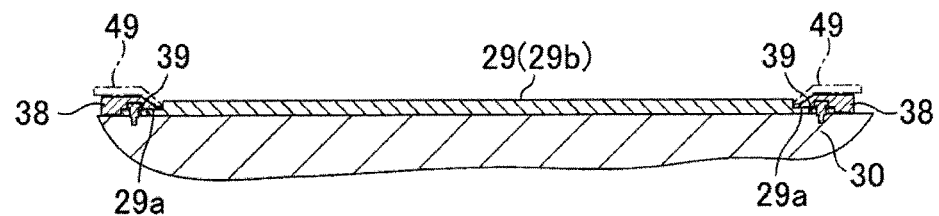

FIGS. 3A and 3B are diagrams for explaining a method of fixing a target to a holder in FIG. 2. FIG. 3A is a top view of the target seen in a direction of a white arrow in FIG. 2. FIG. 3B is a cross sectional view taken along a line 3B-3B in FIG. 3A. In FIGS. 3A and 3B, components blocked by other components are indicated by dashed lines and the shield member 49 is indicated by a dashed dotted line.

Referring to FIGS. 3A and 3B, a stepped portion 29a is formed around the edge of the target 29. The target 29 is fixed to the holder 30 by an approximately annular clamp member 38 (pressing unit) that presses the target 29 against the holder 30 while being in contact with the stepped portion 29a at the respective sides of the target 29. The clamp member 38 is attached to the holder 30 by bolts (not shown).

Figure 4:
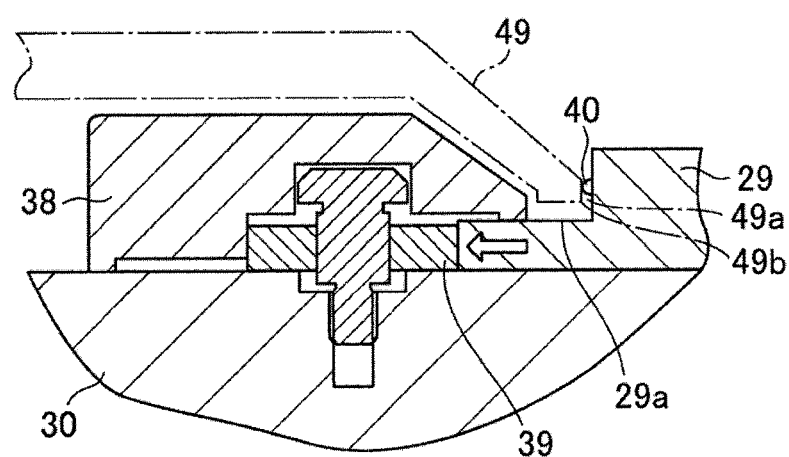
FIG. 4 is an enlarged cross sectional view for explaining a conventional method of fixing a target to a holder.

As described, above, the shield member 49 is provided, around, each target 29. Although the central portion 29b of each target 29 is exposed through an opening 49a formed at the center of the shield member 49, the stepped portion 29a and the clamp member 38 are covered by the shield member 49. Especially, as illustrated in FIG. 4, a gap between the target 29 and an edge 49b of the opening 49a of the shield member 49 is set to be small enough to prevent the introduction of the positive ions and the stepped portion 29a and the clamp member 38 from being sputtered by the positive ions. At this time, if the target 29 with respect to the holder 30 is not exactly positioned, the distance between the target 29 and the edge 49b of the opening 49a, for example, becomes excessively small. Accordingly, the target 29 and the edge 49b of the opening 49a may be short-circuited by a deposit 40 or the like during the PVD processing.

Therefore, in a conventional case, a plurality of positioning blocks 39 is provided at the holder 30. With the contact between the positioning blocks 39 and four side surfaces of the target 29, the movement of the target 29 in the up-down direction and the right-left direction in FIG. 3A is restricted and the target 29 is precisely positioned with respect to the holder 30.

However, when the conventional positioning blocks 39 are made to be in contact with the four side surfaces of the target 29 as illustrated in FIG. 4, the thermal expansion (indicated by the white arrow in the drawing) of the target 29 during the PVD processing is restricted and the target 29 is deformed by an increase of an internal stress. This may result in breakage of the target 29.

In the present embodiment, a space is ensured between the side surfaces of the target 29 and the positioning blocks during the PVD processing.

Figure 5:
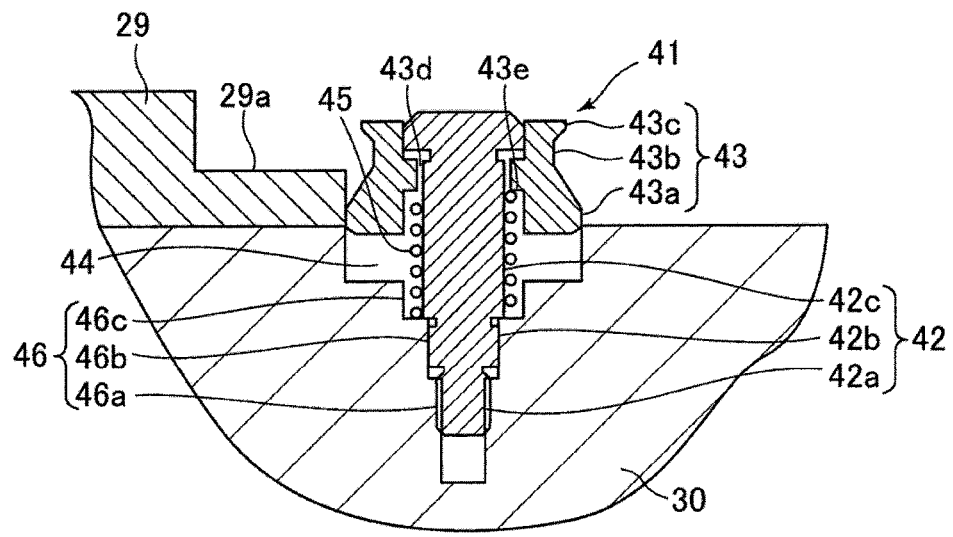
FIG. 5 is a cross sectional view schematically showing a configuration of a positioning block of a fixing unit for a plate-shaped member according to an embodiment.

FIG. 5 is a cross sectional view schematically showing a configuration of a positioning block of a fixing unit for a plate-shaped member according to the present embodiment.

Referring to FIG. 5, the positioning block 41 (positioning unit) has a bolt 42 (shaft part) vertically installed in the holder 30 and a slider 43 (slide part) slidably attached to the bolt 42. The positioning block 41 is provided instead of the positioning block 39 shown in FIG. 3A.

A male screw 42a is formed at a tip portion (lower side in FIG. 5) of the bolt 42. A screw hole 46 is formed at the holder 30. By screwing the male screw 42a into a female screw 46a of the screw hole 46, the bolt 42 is installed in the screw hole 46. A reamed hole 46b is formed above the female screw 46a in the screw hole 46. A reamer part 42b is formed above the male screw 42a of the bolt 42. When the bolt 42 is installed in the screw hole 46, the reamer part 42b is fitted to the reamed hole 46b, Therefore, the bolt 42 can be installed in the screw hole 46 while maintaining the relative position thereof with respect to the screw hole 46, A spring fitting part 42c is formed above the reamer part 42b of the bolt 42. A coil spring 45 (resilient member) is provided around the spring fitting part 42c.

The slider 43 is an approximately cylindrical member having a diameter that varies along an axis direction of the shaft part 42. A contact part 43a having a largest diameter is formed at a lower portion of the slider 43. A clearance part 43b is formed at an opposite side (upper side in FIG. 5) to the holder 30 with respect to the contact part 43a. The diameter of the clearance part 43b is set to be smaller than that of the contact part 43a. A flange part 43c having a diameter larger than that of the clearance part 43b is formed above the clearance part 43b.

With the present embodiment, each of the positioning unit includes the shaft to be installed at the fixing base member in a direction perpendicular to the surface of the fixing base member, and the slide part movable along the shaft, wherein the slide part includes the contact part to be in contact with one of side surfaces of the plate-shaped member and the clearance part formed on the contact part to have a smaller width, in a direction parallel to the surface of the fixing base member, than that of the contact part. Accordingly, the contact part is made to be in contact with the corresponding side surface of the plate-shaped member when the fixing unit is installed at the fixing base member so that the plate-shaped member is placed with respect to the fixing base member.

When the plate-shaped member is placed with respect to the fixing base member, the slide part is moved along the shaft and the clearance part is allowed to face the corresponding side surface of the plate-shaped member. Thus, it is possible to ensure a gap between the clearance part and the plate-shaped member. This makes it possible for the gap to absorb the thermal expansion of the plate-shaped member. As a result, it is possible to prevent the plate-shaped member from being deformed due to the thermal expansion.

The slider 43 has a slide hole 43d formed to penetrate through along the central axis in the up-down direction in FIG. 5. The slide hole 43d accommodates therein the bolt 42. The central axis of the bolt 42 coincides with that of the slide hole 43d (slider 43), so the slider 43 moves along the bolt 42. A lower part of the slide hole 43d has a comparatively large diameter so that an upper portion of the coil spring 45 is accommodated therein. An upper end of the coil spring 45 is in contact with a stepped portion 43e formed at the slide hole 43d.

A slider accommodating part 44 that is a cylindrical recess is formed in the holder 30 to be positioned directly below the slider 43. When the slider 43 is moved toward the holder 30, the slider 43 is partially accommodated in the slider accommodating part 44. Therefore, the slider 43 can move smoothly along the bolt 42 without being disturbed. A depth of the slider accommodating part 44 is set such that the clearance part 43b of the slider 43 can face the side surface of the target 29 when the slider 43 is partially accommodated in the slider accommodating part 44.

In the screw hole 46, a spring accommodating part 46c is formed between the reamed hole 46b and the slider accommodating part 44. A diameter of the spring accommodating part 46c is set to be larger than that of the coil spring 45, so that a lower portion of the coil spring 45 is accommodated in the spring accommodating part 46c, When the bolt 42 is installed in the screw hole 46, the lower end of the spring fitting part 42c becomes in contact with the bottom portion of the spring accommodating part 46c as illustrated in FIG. 5. Accordingly, an axial force of the bolt 42 is generated and the bolt 42 is fixed to the holder 30. Further, a lower end of the coil spring 45 becomes in contact with the bottom portion of the spring accommodating part 46c. At this time, the coil spring 45 biases the slider 43 in an upward direction in FIG. 5 by a reaction force from the bottom portion of the spring accommodating part 46c.

In the present embodiment, the clamp member 38 and the positioning block 41 constitute the fixing unit for the target 29.

Hereinafter, a fixing method for a plate-shaped member according to an embodiment will be described.

First, an operator presses the target 29 against the holder 30. Then, the positioning block 41 is installed in the holder 30 and the contact part 43a of the slider 43 is made to be in contact with the side surface of the target 29 as illustrated in FIG. 5. In the present embodiment, the contact parts 43a of two or more positioning blocks 41 are made to be in contact with two adjacent side surfaces of the target 29 and the positioning blocks 39 are made to be in contact with the other side surfaces of the target 29 (positioning step). Accordingly, the movement of the target 29 in the horizontal direction in FIG. 5 is restricted, which makes it possible to precisely place the target 29 with respect to the holder 30. At this time, the slider 43 is biased by the coil spring 45 in the upward direction in FIG. 5, so the movement of the slider 43 toward the holder 30 is restricted. As a result, the contact between the contact part 43a and the side surface of the target 29 can be maintained.

The positioning block 41 is installed in the holder 30 by screwing the bolt 42 into the screw hole 46. Thus, the positioning block 41 can be easily installed in the holder 30 with a reduced burden of the operator. At this time, the reamer part 42b of the bolt 42 is fitted to the reamed hole 46b of the screw hole 46. Accordingly, the positioning accuracy of the positioning block 41 with respect to the holder 30 can be improved and, further, the positional accuracy of the target 29 which is placed by the positioning block 41 can be improved.

Figure 6:
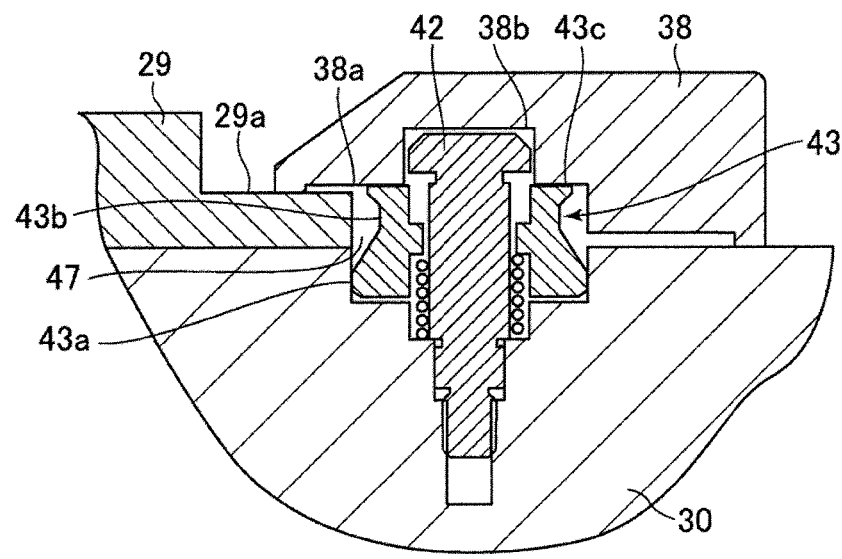
FIGS. 6 to 8 are cross sectional views for explaining a method of fixing a plate-shaped member according to the embodiment.

Next, as illustrated in FIG. 6, the clamp member 38 is installed at the holder 30 while making contact with the stepped portion 29a of the target 29 and pressing the target 29 against the holder 30. As a consequence, the target 29 is fixed to the holder 30 (fixing step). At this time, a lower surface 38a of the clamp member 38 becomes in contact with the flange part 43c of the slider 43 and presses the slider 43 downward in FIG. 6. As a result, the contact between the contact part 43a and the side surface of the target 29 is released and the clearance part 43b is made to face the side surface of the target 29. Accordingly, a gap 47 can be obtained between the target 29 and the clearance part 43b. When the clamp member 38 is installed at the holder 30, the lower surface 38a of the clamp member 38 is made to be in contact with the flange part 43c of the slider 43 to move the slider 43. Therefore, a step of moving the slider 43 is not required, which can reduce a burden of the operator.

Since the target 29 is fixed to the holder 30 by the clamp member 38, the target 29 is not moved relative to the holder 30 when the slider 43 is moved downward and the position of the target 29 with respect to the holder 30 is maintained. A bolt receiving part 38b is formed at the lower surface 38a of the clamp member 38. When the clamp member 38 is installed to the holder 30, an upper portion of the bolt 42 is accommodated in the bolt receiving part 38b. Accordingly, the interference between the bolt 42 and the clamp member 38 can be prevented.

Figure 7:
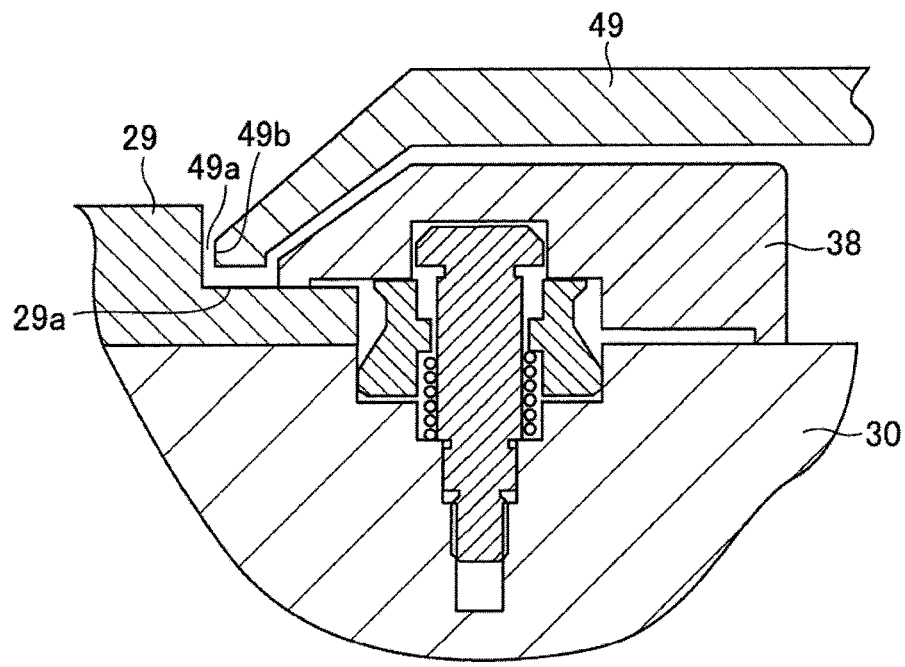

Next, as illustrated, in FIG. 7, the stepped portion 29a and the clamp member 38 are covered by the shield member 49. However, the distance between the edge 49b of the hole 49a and the target 29 does not become excessively small. This is because the position of the target 29 with respect to the holder 30 is maintained while the slider 43 is moved downward after the target 29 is precisely positioned by the contact between the side surface of the target 29 and the contact part 43a of the slider 43. As a result, it is possible to prevent short-circuit between the target 29 and the edge 49b of the opening 49a.

Figure 8:
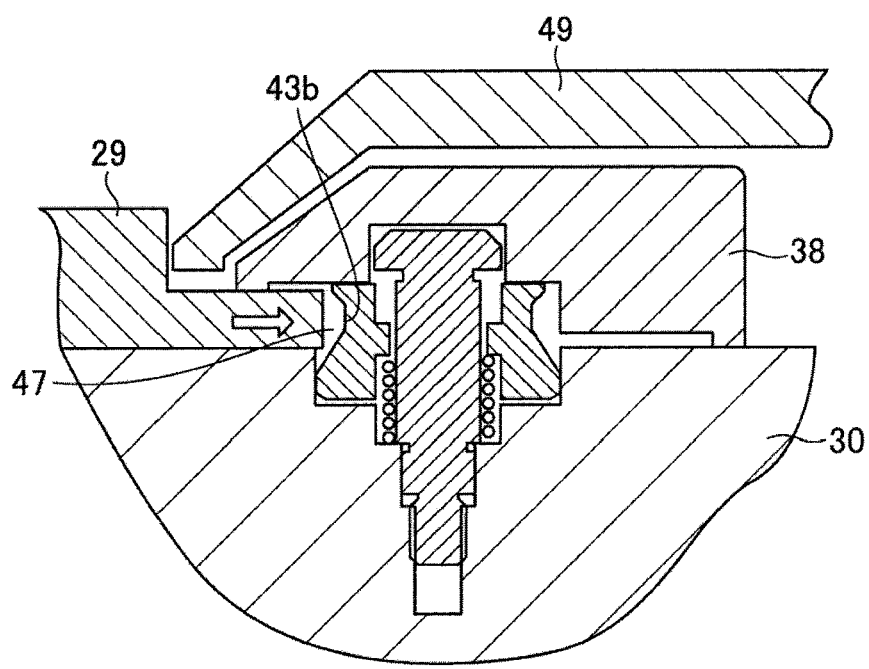

Thereafter, the PVD processing is performed on the wafer W in the process module 13. In that case, even if the target 29 is thermally expanded (indicated by the white arrow) by plasma irradiation or the like as illustrated in FIG. 8, the thermal expansion of the target 29 in the horizontal direction in FIG. 8 can be absorbed by the gap 47 between the side surface of the target 29 and the clearance part 43b of the slider 43. Therefore, the thermal expansion of the target 29 is not restricted. As a result, the target 29 can be prevented from being deformed by the thermal expansion and the increase of the internal stress.

While the disclosure has been described with respect to the embodiments, the disclosure is not limited thereto.

For example, one or more positioning blocks 41 may be in contact with side surfaces of the target 29. Further, one or more clamp members 38 may be provided to press the stepped portions 29a formed at the four side surfaces of the target 29.

In the above-described embodiments, the positioning blocks 41 are provided in two adjacent side surfaces of the target 29. However, the positioning blocks 41 may be provided in three or four side surfaces of the target 29.

In the above-described embodiments, the target 29 has a rectangular shape. However, the shape of the target 29 is not limited thereto and may be cylindrical or triangular.

While the disclosure has been shown and described with respect to the embodiments, it will be understood by those skilled in the art that various changes and modifications may be made without departing from the scope of the disclosure as defined in the following claims.

What is claimed is:

1. A fixing unit for fixing a plate-shaped member to a surface of a fixing base member, the fixing unit comprising:
   a pressing unit operable for pressing the plate-shaped member toward the fixing base member; and
   a plurality of positioning units, installed at the fixing base member and configured to position the plate-shaped member with respect to the fixing base member,
   wherein each of the positioning units includes:
      a shaft configured to be installed at the fixing base member in a direction perpendicular to the surface of the fixing base member;
      a slide part movable along the shaft, and
      a resilient member operable for pressing the slide part toward an opposite side to the fixing base member when the shaft is installed at the fixing base member; and
   wherein the slide part includes a contact part configured to be in contact with a side surface of the plate-shaped member when the resilient member is in a non-compressed state, wherein the slide part also includes a clearance part formed on the contact part to have a smaller width, in a direction parallel to the surface of the fixing base member, than that of the contact part and configured to face the side surface of the plate-shaped member when the pressing unit presses the plate-shaped member and the slide part toward the fixing base member to move the slide part toward the fixing base member.

2. The fixing unit of claim 1, wherein the fixing base member has an accommodating part configured to accommodate the slide part when the pressing unit presses the slide part to move toward the fixing base member.

3. The fixing unit of claim 1, wherein the clearance part is provided at an opposite side to the fixing base member when the shaft is installed at the fixing base member.

4. The fixing unit of claim 1, wherein the plate-shaped member has a rectangular shape and the plurality of the positioning units is provided at at least two side surfaces of the plate-shaped member to allow the contact part of each of the positioning units to be in contact with the corresponding side surface of the plate-shaped member.

5. The fixing unit of claim 1, wherein the shaft includes a screw portion at the tip portion thereof and the screw portion of the shaft is to be provided in a screw hole formed at the fixing base member.

6. The fixing unit of claim 5, wherein the shaft further includes a fitting part adjacent the screw portion and a reamed hole is formed in the screw hole, and wherein when the shaft is installed in the screw hole, the fitting part is fitted to the reamed hole.

7. A PVD processing apparatus comprising the fixing unit of claim 1, the apparatus comprising a chamber having a processing space therein, wherein the plate-shaped member is exposed to the processing space, and wherein the fixing base member is at the chamber; and wherein the plate-shaped member is fixed to the fixing base member through the use of the fixing unit.

8. A fixing method for fixing a plate-shaped member to a surface of a fixing base member by a fixing unit, the fixing unit including: a pressing unit configured to press the plate-shaped member toward the fixing base member; and a plurality of positioning units, installed at the fixing base member and configured to position the plate-shaped member with respect to the fixing base member, wherein each of the positioning units includes: a shaft configured to be installed at the fixing base member in a direction perpendicular to the surface of the fixing base member; a slide part moving along the shaft; and a resilient member for pressing the slide part toward an opposite side to the fixing base member when the shaft is installed at the fixing base member, and wherein the slide part includes a contact part to be in contact with one of the side surfaces of the plate-shaped member when the resilient member is in a non-compressed state and also includes a clearance part formed on the contact part to have a smaller width, in a direction parallel to the surface of the fixing base member, than that of the contact part and configured to face the side surface of the plate-shaped member when the pressing unit presses the plate-shaped member and the sliding part toward the fixing base member to move the sliding part toward the fixing base member, the fixing method comprising:
  positioning the plate-shaped member with respect to the fixing base member by allowing the contact pails of the slide parts of the plurality of positioning units respectively contact with at least two side surfaces of the plate-shaped member; and
  fixing the plate-shaped member to the fixing base member by pressing the plate-shaped member against the fixing base member by the pressing unit so that the slide pails of the positioning units are respectively moved along the corresponding shafts to allow the clearance parts of the slide parts to be arranged to face the corresponding side surfaces of the plate-shaped member.

9. The fixing unit of claim 1, wherein when the plate-shaped member is positioned with respect to the fixing base member, there is a gap between the clearance part and the plate-shaped member due to the smaller width of the clearance part relative to that of the contact part.

10. The fixing unit of claim 1, wherein the resilient member comprises a spring that is compressed and presses the slide part from the fixing base member when the shaft is installed in the fixing base member.

11. The fixing unit of claim 1, wherein the contact of the contact part with the side surface of the plate-shaped member holds the plate-shaped member in place when the resilient member is in the non-compressed state, until the pressing unit presses the plate-shaped member toward the fixing base member;
  wherein, when the plate-shaped member is pressed toward the fixing base member by the pressing unit, the resilient member is in a compressed state and the pressing unit also presses the slide part including the contact part and the clearance part toward the fixing base member so that the contact of the contact part with the side surface of the plate-shaped member is released and the clearance part faces the side surface, forming a gap between the clearance part and the plate-shaped member.

* * * * *